(12) United States Patent
Jeong et al.

(10) Patent No.: US 8,633,397 B2
(45) Date of Patent: Jan. 21, 2014

(54) METHOD OF PROCESSING CAVITY OF CORE SUBSTRATE

(75) Inventors: Jin-Soo Jeong, Seoul (KR); Doo-hwan Lee, Euijungboo-si (KR); Hwa-Sun Park, Suwon-si (KR); Jae-Kul Lee, Seoul (KR); Yul-Kyo Chung, Yongin-si (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 46 days.

(21) Appl. No.: 12/860,301

(22) Filed: Aug. 20, 2010

(65) Prior Publication Data
US 2011/0048780 A1    Mar. 3, 2011

(30) Foreign Application Priority Data

Aug. 25, 2009  (KR) .................. 10-2009-0078738
Oct. 27, 2009  (KR) .................. 10-2009-0102504

(51) Int. Cl.
*H05K 1/16*    (2006.01)

(52) U.S. Cl.
USPC ................. 174/260; 174/261; 174/262

(58) Field of Classification Search
None
See application file for complete search history.

(56) References Cited

U.S. PATENT DOCUMENTS

| | | | |
|---|---|---|---|
| 5,889,654 A * | 3/1999 | Pierson et al. | 361/720 |
| 5,923,084 A * | 7/1999 | Inoue et al. | 257/712 |
| 6,159,767 A * | 12/2000 | Eichelberger | 438/107 |
| 6,538,210 B2 * | 3/2003 | Sugaya et al. | 174/258 |
| 7,274,099 B2 * | 9/2007 | Hsu | 257/701 |
| 7,579,690 B2 * | 8/2009 | Chia | 257/723 |
| 8,101,868 B2 * | 1/2012 | Ito et al. | 174/260 |
| 2006/0283627 A1 * | 12/2006 | Chen et al. | 174/260 |
| 2008/0054443 A1 * | 3/2008 | Shih | 257/698 |

FOREIGN PATENT DOCUMENTS

| | | |
|---|---|---|
| JP | 2004-327532 | 11/2004 |
| JP | 2007-318090 A | 12/2007 |
| JP | 2009-105345 A | 5/2009 |
| KR | 10-0697980 | 3/2007 |
| KR | 10-0758229 | 9/2007 |
| KR | 10-2007-0821154 B1 | 10/2007 |

OTHER PUBLICATIONS

Korean Office Action, w/ partial English translation thereof, issued in Korean Patent Application No. KR 10-2009-0078738 dated Jan. 4, 2011.
Korean Office Action, w/ partial English translation thereof, issued in Korean Patent Application No. KR 10-2009-0102504 dated Mar. 14, 2011.
Office Action issued in Taiwan Patent Application No. 099124561 dated Feb. 26, 2013.
Chinese Office Action with English translation issued in application No. 201010263257.8 issued on May 3, 2012.
Japanese Office Action with partial English translation issued in application No. 2010-178924 issued on Jun. 5, 2012.

* cited by examiner

*Primary Examiner* — Ishwarbhai B Patel
(74) *Attorney, Agent, or Firm* — McDermott Will & Emery LLP

(57) ABSTRACT

A method of processing a cavity of a core substrate is disclosed. The method of processing a cavity of a core substrate in accordance with an embodiment of the present invention can include: forming a first processing area on one surface of a core substrate, the first processing area being demarcated by a circuit pattern; forming a second processing area on the other surface of the core substrate, the second processing area being demarcated by a circuit pattern; and processing a cavity by removing the entire first processing area from the one surface of the core substrate.

11 Claims, 10 Drawing Sheets

FIG. 7
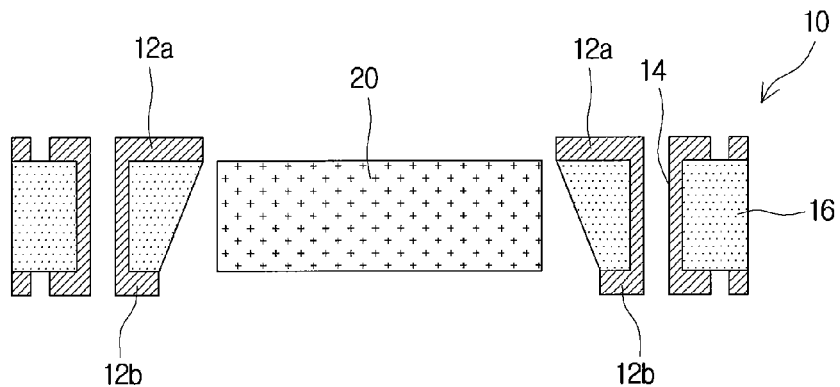
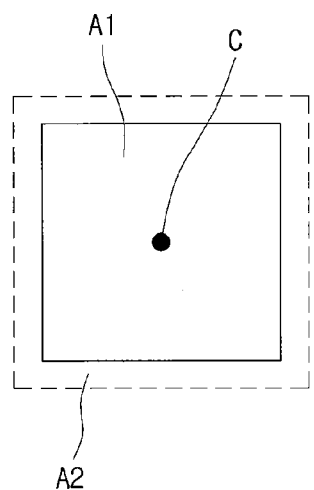
FIG. 8A
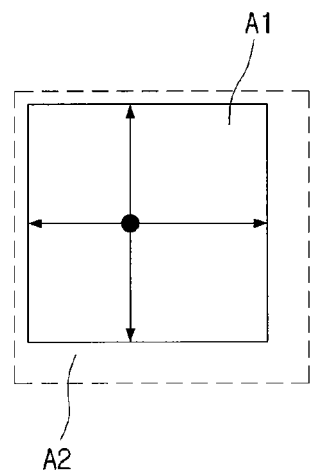
FIG. 8B
FIG. 9
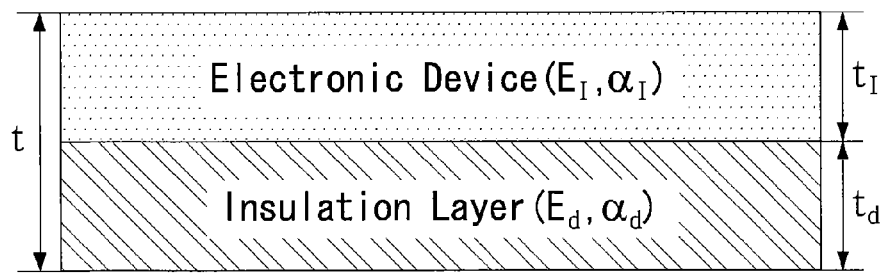

METHOD OF PROCESSING CAVITY OF CORE SUBSTRATE

CROSS-REFERENCE TO RELATED APPLICATIONS

This application claims the benefit of Korean Patent Application No. 10-2009-0102504 and 10-2009-0078738, filed with the Korean Intellectual Property Office on Oct. 27, 2009 and Aug. 25, 2009, respectively, the disclosure of which is incorporated herein by reference in its entirety.

BACKGROUND

1. Technical Field

The present invention is related to a method of processing a cavity of a core substrate.

2. Description of the Related Art

In order to manufacture an embedded substrate, in which an electronic device is embedded in a substrate, it is necessary to process a cavity, which is the space for mounting the electronic device, in the substrate. The cavity can be processed in the substrate by a punching method, which is a mechanical process using a CNC drill or a mold, a drilling method using laser (CO2 laser or YAG laser) and the like.

When the cavity is processed with a mechanical process, the size of the cavity is not precise, and the mechanical friction with the substrate can potentially cause defects such as burr, crack and whitening on an inner wall of the cavity. For this reason, the cavity is often processed by use of a laser drill.

In the conventional method, a circuit is formed on a core substrate, and then a cavity is formed by directly laser-drilling an exposed insulation layer. In this case, a laser beam removes a portion of the exposed insulation layer to form the cavity, but areas other than the cavity itself of the insulation layer are also damaged (deformed) by the laser beam. Moreover, the shape of a beam mask of the laser drill is transferred to the surface of the insulation layer, thereby lowering the precision of the cavity size.

SUMMARY

The present invention provides a method of processing a cavity of a core substrate that can realize a precise cavity shape.

An aspect of the present invention features a method of processing a cavity of a core substrate. The method of processing a cavity of a core substrate in accordance with an embodiment of the present invention can include: forming a first processing area on one surface of a core substrate, the first processing area being demarcated by a circuit pattern; forming a second processing area on the other surface of the core substrate, the second processing area being demarcated by a circuit pattern; and processing a cavity by removing the entire first processing area from the one surface of the core substrate.

The second processing area can be wider than the first processing area, and a center of the first processing area and a center of the second processing area can be placed on a same vertical line. The first processing area and the second processing area can have a similar shape.

Additional aspects and advantages of the present invention will be set forth in part in the description which follows, and in part will be obvious from the description, or may be learned by practice of the invention.

BRIEF DESCRIPTION OF THE DRAWINGS

FIG. 7 illustrates an electronic device embedded in a core substrate in which a cavity is processed in accordance with another embodiment of the present invention.

FIG. 8A and FIG. 8B illustrate a first processing area and a second processing area in accordance with another embodiment of the present invention.

FIG. 9 is a modeling diagram for a stress test when an electronic device and an insulation layer are stacked to each other.

DETAILED DESCRIPTION

Figure 1:
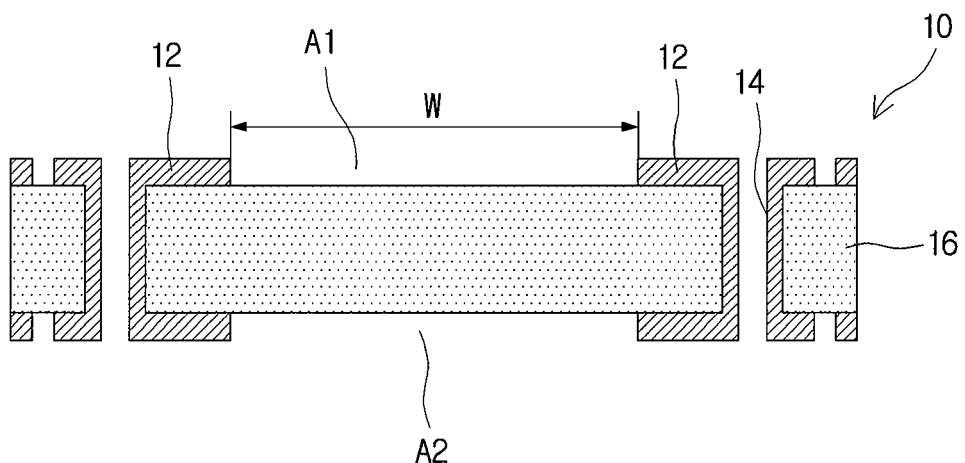
FIG. 1 to FIG. 3 illustrate a method of processing a cavity of a core substrate in accordance with an embodiment of the present invention.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the ideas and scope of the present invention. Throughout the description of the present invention, when describing a certain technology is determined to evade the point of the present invention, the pertinent detailed description will be omitted.

Hereinafter, certain embodiments of a method of processing a cavity of a core substrate will be described in detail with reference to the accompanying drawings. Identical or corresponding elements will be given the same reference numerals, regardless of the figure number, and any redundant description of the identical or corresponding elements will not be repeated.

Figure 2:
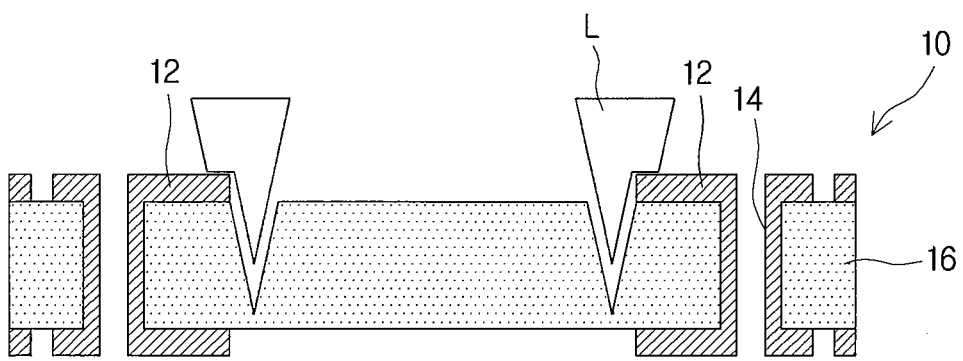
Figure 3:
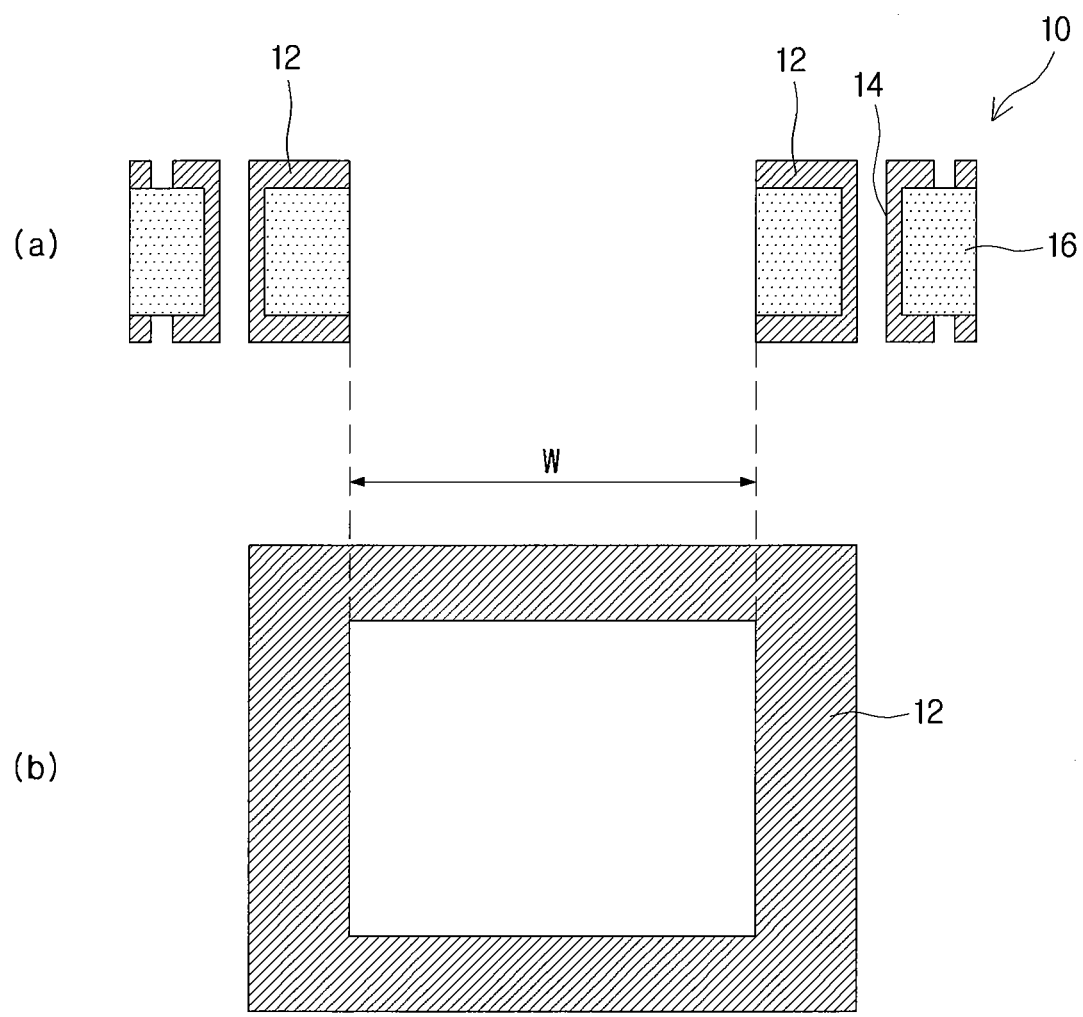

FIG. 1 to FIG. 3 illustrate a method of processing a cavity of a core substrate in accordance with an embodiment of the present invention. Illustrated in FIG. 1 to FIG. 3 are a core substrate 10, a first processing area A1, a second processing area A2, a circuit pattern 12, a via 14, an insulator 16, a laser beam L.

First, as shown in FIG. 1, the first processing area A1 demarcated by the circuit pattern 12 is formed on one surface of the core substrate 10, more specifically on one surface of the insulator 16. Here, the first processing area A1 refers to a surface on one side of the insulator 16 that is directly irradiated by a laser beam. This first processing area A1 is demarcated by the circuit pattern 12 formed on surfaces of the insulator 16. In other words, an area that is exposed without being covered by the circuit pattern 12 becomes the first processing area A1.

The circuit pattern 12 can be formed on one surface of the insulator 16 by a subtractive process, an additive process, an inkjet process, and other various processes.

On the other surface of the insulator 16, the second processing area A2 demarcated by the circuit pattern 12 is formed. Like the first processing area A1, the second processing area A2 is demarcated by the circuit pattern 12 formed on a lower surface of the insulator 16, and refers to an area that is exposed without being covered by the circuit pattern 12 formed on the lower surface of the core substrate 10. In the case of the present embodiment, the second processing area A2 is formed to be symmetric with the first processing area A1. That is, the first processing area A1 and the second processing area A2 are formed at symmetrical locations about the insulator 16 in the same size and shape.

The circuit patterns 12 formed on upper and lower surfaces of the insulator 16 can be electrically connected to each other by the via 14, which penetrates the insulator 16.

After the first processing area A1 and the second processing area A2 are formed as described above, a cavity is formed by removing the entire first processing area A1 from one surface of the core substrate 10 by use of the laser beam L, as illustrated in FIG. 2. By processing the cavity as described above, the originally-designed shape and size W of the cavity can be stably secured because the shape of the cavity is demarcated by the circuit pattern 12, as illustrated in FIG. 3. In other words, the size of the cavity is determined by the circuit pattern 12. Therefore, the precision of the cavity size can be improved, and the processing quality of inner walls and surfaces of the cavity can be improved. FIG. 3 illustrates that a rectangular-shaped processing area is demarcated by the circuit pattern 12 and a cavity in the shape of a rectangular column is formed.

Figure 4:
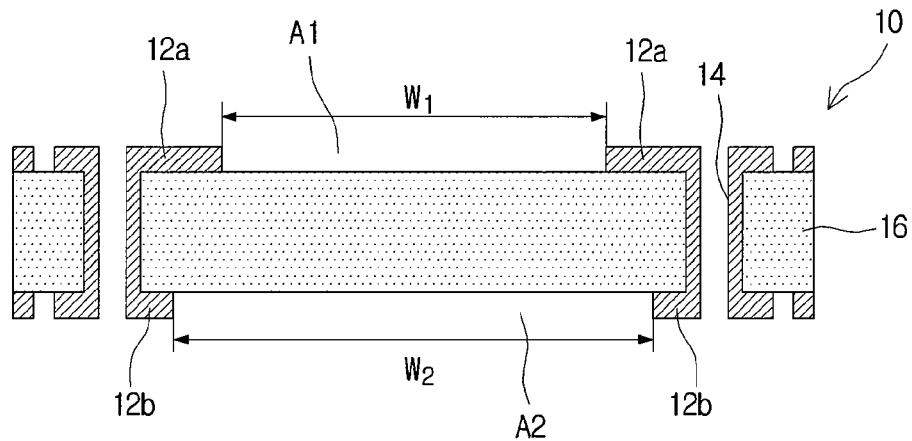
FIG. 4 to FIG. 5 illustrate a method of processing a cavity of a core substrate in accordance with another embodiment of the present invention.
Figure 5:
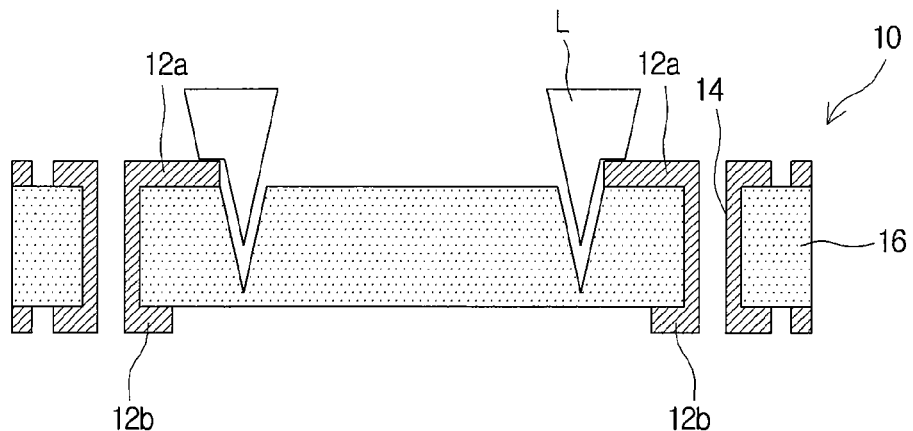
Figure 6:
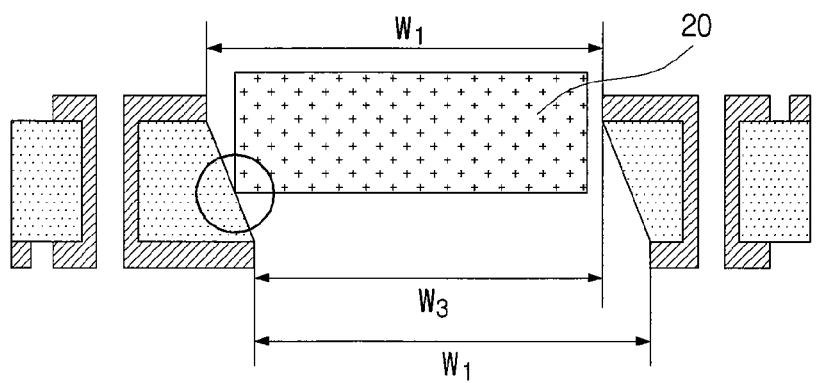
FIG. 6 illustrates a cavity with interlayer eccentricity.

FIG. 4 to FIG. 6 illustrate a method of processing a cavity of a core substrate 10 in accordance with another embodiment of the present invention. This embodiment is different from the earlier-described embodiment in that the second processing area A2 is formed wider than the first processing area A1. Hereinafter, differences between the earlier-described embodiment and the present embodiment will be mainly described.

According to the present embodiment, as illustrated in FIG. 4, the second processing area A2 is formed wider than the first processing area A1. FIG. 4 illustrates that the first processing area A1 has the size of W1 and the second processing area A2 has the size of W2.

By designing and forming the second processing area A2 to be bigger than the first processing area A1, even if there is some interlayer eccentricity while circuit patterns 12a, 12b are formed on upper and lower surfaces of the core substrate 10, it becomes possible to prevent the size of the cavity from being reduced due to the eccentricity and precisely process the cavity having a desired size. FIG. 5 illustrates how the cavity is processed using a laser beam L.

FIG. 6 illustrates a case of the cavity with a reduced size due to the interlayer eccentricity. As shown in FIG. 6, when there is eccentricity between upper and lower circuit patterns 12 of the core substrate 10, it becomes inevitable that the cavity results in a smaller size W3 than the originally designed cavity size W1 due to a slope formed in the cavity. That is, the space for embedding an electronic device 20 becomes reduced.

By forming the second processing area A2 to be bigger than the first processing area A1, the difference in size between the first processing area A1 and the second processing area A2 can complement the eccentricity, as shown in FIG. 7, and the originally designed cavity size can be obtained.

Since the eccentricity of the circuit patterns 12a, 12b can occur in both an x-axis direction and a y-axis direction, the center of the first processing area A1 and the center of the second processing area A2 can be placed on a same vertical line in order to complement the eccentricity of the circuit patterns 12a, 12b. FIG. 8A illustrates that the center of the first processing area A1 is overlapped with the center of the second processing area A2.

In addition, by making the first processing area A1 and the second processing area A2 in a similar shape, the eccentricity of the circuit patterns 12a, 12b in every direction can be more fully complemented. FIG. 8A and FIG. 8B show that both the first processing area A1 and the second processing area A2 have the shape of a square.

Hereinafter, an electronic device embedded printed circuit board in accordance with another aspect of the present invention will be described.

Figure 10:
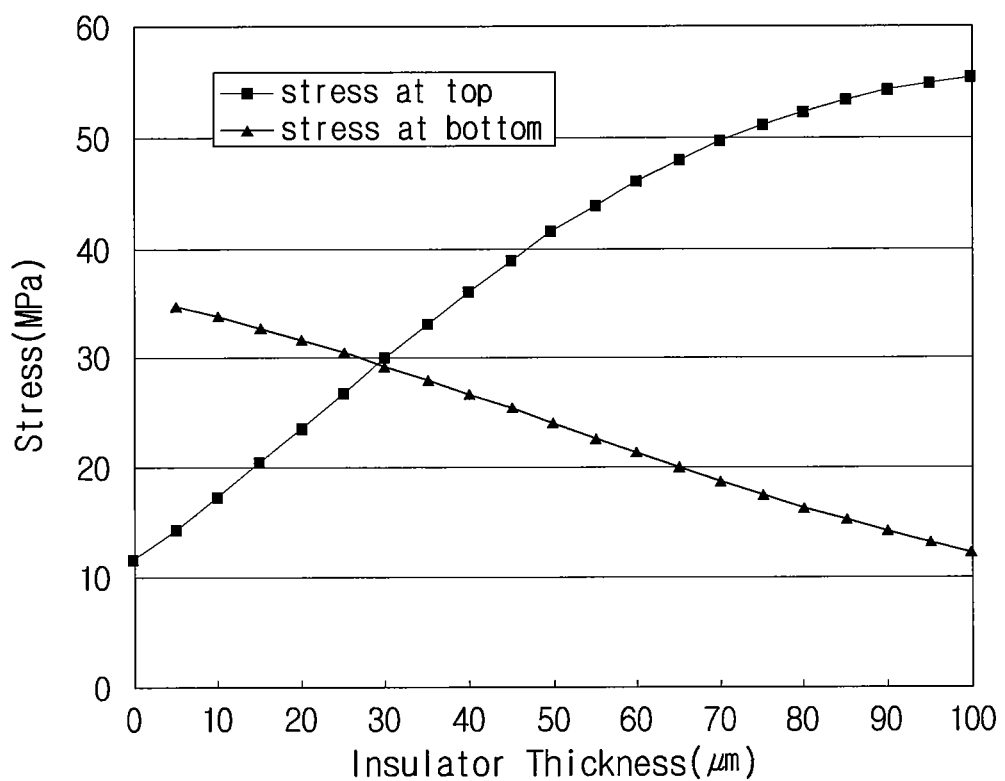
FIG. 10 is a graph illustrating the stress for different thicknesses of an insulation layer.
Figure 11:
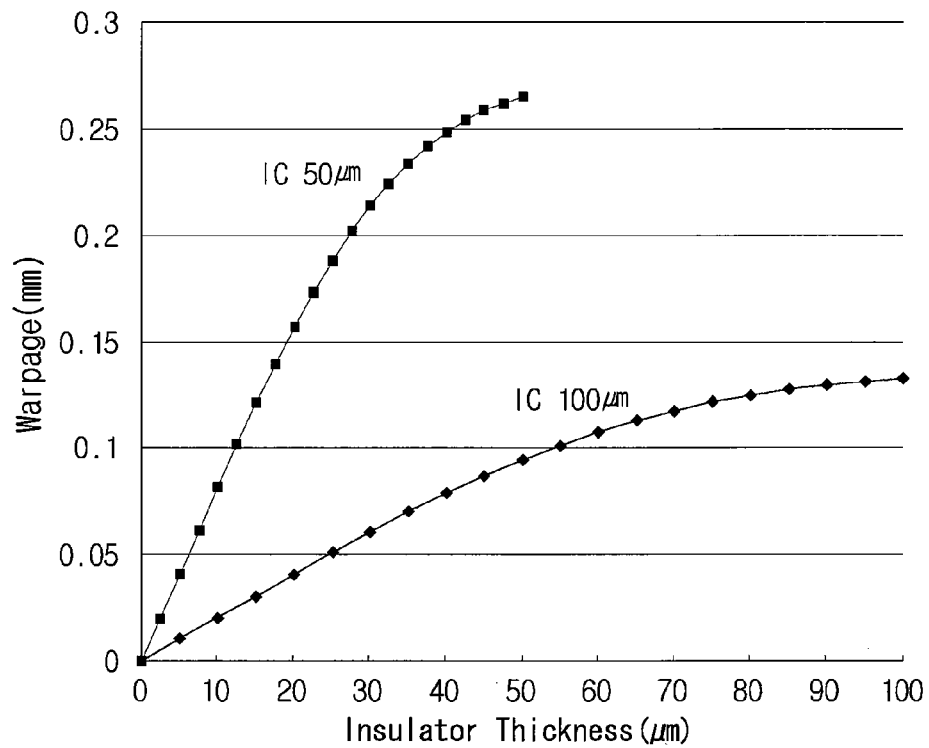
FIG. 11 is a graph illustrating the warpage for different thicknesses of an insulation layer.
Figure 12:
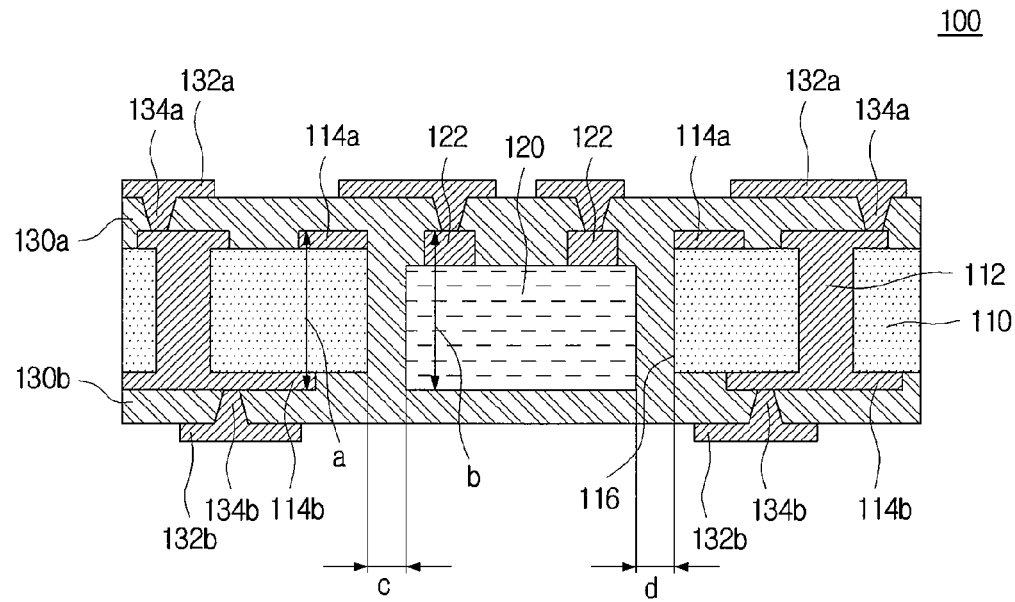
FIG. 12 is a conception diagram illustrating an electronic device embedded printed circuit board in accordance with an embodiment of the present invention.

FIG. 9 is a modeling diagram for a stress test when an electronic device and an insulation layer are stacked to each other. FIG. 10 is a graph illustrating the stress according to the thickness of an insulation layer. FIG. 11 is a graph illustrating the warpage according to the thickness of an insulation layer. FIG. 12 is a conception diagram illustrating an electronic device embedded printed circuit board in accordance with an embodiment of the present invention.

The present embodiment features a geometrically symmetric electronic device embedding structure and a method of embedding an electronic device for such structure, in order to realize an ultra-thin, highly-reliable electronic device embedded printed circuit board that minimizes the warpage in a repeated thermal stress environment. The warpage of a substrate under thermal stress is determined by physical property values, such as the coefficient of thermal expansion (CTE), Young's modulus and Poisson ratio, and geometric factors of applied materials. For a printed circuit board illustrated in FIG. 9, the neutral line can be expressed in the following expression.

$$\bar{y} = \frac{E_I t^2 + t_d^2 (E_d - E_I)}{2(E_d t_d + E_I t_I)} \quad (1)$$

Here, $E_I$ is Young's modulus of the electronic device, $t_I$ is the thickness (m) of the electronic device, $E_d$ is Young's modulus (Pa) of the insulation layer, $t_d$ is the thickness of the insulation layer, and t is the overall thickness ($=t_d+t_I$) of the substrate.

The bending moment M (expressed in Nm) and the normal force N (expressed in N) of the substrate calculated from the above expression are expressed in the following expressions.

$$M_1 = M_2 \quad (2)$$
$$= E_I \alpha_I \Delta T t_I w \left(t_d + \frac{t_I}{2} - \bar{y}\right) + E_d \alpha_d \Delta T t_d w \left(\frac{t_d}{2} - \bar{y}\right), M_6$$
$$= 0$$

$$N_1 = N_2$$
$$= E_I \alpha_I \Delta T t_I w + E_d \alpha_d \Delta T t_d w, N_6$$
$$= 0$$

Here, $E_I$ is Young's modulus of the electronic device, $t_I$ is the thickness of the electronic device, $\alpha_I$ is the CTE of the electronic device, $E_d$ is Young's modulus (Pa) of the insulation layer, $t_d$ is the thickness of the insulation layer, $\alpha_d$ is the CTE (m/K) of the insulation layer, $\Delta T$ is the change in temperature (K), and w is the width of the substrate.

The compliance matrix calculated from the above expression can be expressed in the following expression.

$$S = \begin{pmatrix} \frac{1}{E_x} & -\frac{v_{xy}}{E_x} & 0 \\ -\frac{v_{yx}}{E_y} & \frac{1}{E_y} & 0 \\ 0 & 0 & \frac{1}{G_{xy}} \end{pmatrix} \quad (3)$$

The stiffness matrix calculated from the above expression is as follows.

$$Q = S^{-1} \quad (4)$$

The ABD matrix can be expressed in the following expression.

$$\begin{bmatrix} N_1 \\ N_2 \\ N_6 \\ M_1 \\ M_2 \\ M_6 \end{bmatrix} = \begin{bmatrix} A_{11} & A_{12} & A_{16} & B_{11} & B_{12} & B_{16} \\ A_{21} & A_{22} & A_{26} & B_{21} & B_{22} & B_{26} \\ A_{61} & A_{62} & A_{66} & B_{61} & B_{62} & B_{66} \\ B_{11} & B_{12} & B_{16} & D_{11} & D_{12} & D_{16} \\ B_{21} & B_{22} & B_{26} & D_{21} & D_{22} & D_{26} \\ B_{61} & B_{62} & B_{66} & D_{61} & D_{62} & D_{66} \end{bmatrix} \begin{bmatrix} \varepsilon_1 \\ \varepsilon_2 \\ \varepsilon_6 \\ \kappa_1 \\ \kappa_2 \\ \kappa_6 \end{bmatrix} \quad (5)$$

$$A_{ij} = \int Q_{ij} dz$$

$$B_{ij} = \int Q_{ij} z \, dz$$

$$D_{ij} = \int Q_{ij} z^2 dz$$

The strain and curvature of the substrate can be obtained by the following expression.

$$\begin{bmatrix} \varepsilon \\ \kappa \end{bmatrix} = [ABD]^{-1} \begin{bmatrix} N \\ M \end{bmatrix} \quad (6)$$

The stress evaluation obtained from the above calculation is as follows.

mechanical strain $\bar{\epsilon}_x = \epsilon_1 + \kappa_1 z$ total strain $\epsilon_x = \bar{\epsilon}_x - \alpha \Delta T$ Stress $\sigma = Q_{11} \epsilon_x$ (7)

FIG. 10 is the stress evaluation rendered in a graph. That is, FIG. 10 shows the change in stress on a top side and a bottom side of the substrate according to the thickness of the insulation layer, assuming that the electronic device has the fixed thickness of 100 um.

FIG. 11 illustrates the dependence of the thickness of the electronic device on the thickness of the insulation layer that is calculated on the basis of the warpage. In other words, FIG. 11 shows the warpage of the substrate according to the thickness of the insulation layer when the electronic device has the fixed thicknesses of 50 um and 100 um.

In FIG. 11, assuming that the thickness of the insulation layer is 50 um, while an IC having the thickness of 50 um has the warpage of 0.26 mm, the warpage is reduced to ⅓ to 0.09 mm when the thickness of the IC is doubled to 100 um. From this, it can be inferred that the warpage of a substrate depends far more on the thickness of the electronic device than on the thickness of the insulation layer. Accordingly, it can be expected that, in a geometrically asymmetric printed circuit board, reducing the thickness of the substrate, as the electronic device becomes thinner, will increase the warpage to an unbearable level.

To solve this problem, the warpage needs to be minimized by adjusting the electronic device to be placed in the center about the insulation layer of the substrate to make the electronic device geometrically symmetric. In the present embodiment, the ultra-thin, highly-reliable electronic device embedded printed circuit board that minimizes the warpage under repeated thermal stress is realized by giving a geometric symmetry to the electronic device embedded printed circuit board.

FIG. 12 is a sectional view of an electronic device embedded printed circuit board 100 in accordance with an embodiment of the present invention. As illustrated in FIG. 12, the electronic device embedded printed circuit board 100 in accordance with the present embodiment includes a core substrate 110, in which a cavity 116 is formed, an electronic device 120, which is embedded in the cavity 116 by a face-up method and has an electrode 122 formed on a surface thereof, a first insulation layer 130a, which is stacked on an upper surface of the core substrate 110, and a second insulation layer 130b, which is stacked on a lower surface of the core substrate 110 and has a same thickness as the first insulation layer 130a. Here, the thickness (represented by "b") of the electronic device including the thickness of the electrode 122 is same as the thickness of the core substrate 110.

Here, the term "same" does not necessarily refer to a mathematically precise identical numerical thickness, but a substantially identical thickness in which a design error, a manufacturing error and a measurement error are considered. Hereinafter, the meaning of "same" used in this description will refer to the substantial sameness described above.

The electronic device embedded printed circuit board 100 in accordance with the present embodiment minimizes the warpage of the substrate by designing and manufacturing the embedded electronic device 120 in a symmetric structure. Furthermore, by designing the thickness ("b") of the electronic device including the thickness of the electrode 122 to be the same as that of the core substrate 110, symmetry of the core substrate 110 itself can be provided, and as a result the warpage of the core substrate 110 itself, in which the electronic device 120 is embedded, can be minimized. In other words, in realizing the vertical symmetry of the core substrate 110, the thickness of the electrode 122 formed on the surface of the electronic device 120 is also considered, thereby maximizing the symmetry of the core substrate 110 itself. This symmetric structure functions to lower the risk of increasing the warpage as the printed circuit board and the electronic device 120 embedded in the printed circuit board become thinner.

Moreover, by mounting the electronic device 120 being embedded in the core substrate 100 by a face-up method, the circuit can be better matched. In an actual printed circuit board, an upper surface and a lower surface are off-matched by about 20 um to 50 um, but the matching between the electrode of the electronic device and the circuit on the board can be improved by embedding the electronic device 120 with a face-up method and placing the electrode 122 upward as in the case of the present embodiment.

In case inner circuits 114a, 114b are formed on the surface of the core substrate 110, the thickness ("b") of the electronic device 120 including the thickness of the electrode can be designed to be same as the thickness ("a") of the core substrate 110 including the thicknesses of the inner layers 114a, 114b.

It is preferred that the sum of distances between vertical sides on either end of the electronic device 120 and an inner wall of the cavity 116 is at least 60 um. Since the cavity 116 is processed by use of a punch or laser and the electronic device 120 can be chipped during a dicing process, the distance is based on an outermost line of each rough interface.

Although the distance between the electronic device 120 and the inner wall is designed to be 30 um at the minimum, it is possible that the electronic device 120 makes contact with the inner wall on one side due to equipment tolerance. Therefore, it is preferable that the range of each of "c" and "d" is between 0 and 60 um, and the sum of "c" and "d" is at least 60 um.

When one side is designed to be less than 50 um, it is observed that the electronic device 120 is not properly inserted in the cavity 116 but is laid on one side of the cavity 116. Moreover, according to a simulation and real data, the warpage was reduced as the cavity 116 becomes bigger. However, if the cavity 116 becomes too thin, it becomes difficult to secure the space for the circuit, and thus it is preferable that the maximum value of "c+d" is 160 um or less.

Hitherto, the structure of the electronic device embedded printed circuit board in accordance with an embodiment of the present invention has been described. Hereinafter, a method of manufacturing the electronic device embedded printed circuit board will be described with reference to FIG. 13 to FIG. 19. Since the structure of the electronic device embedded printed circuit board in accordance with the present embodiment is identical to that of the above-description, no structural features will be described, but the manufacturing process will be mainly described.

Figure 13:
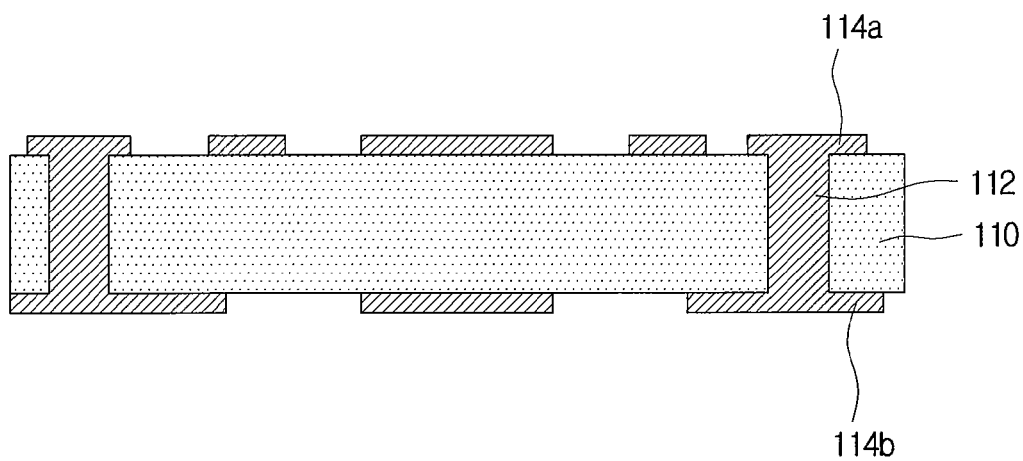
FIG. 13 to FIG. 19 illustrate a process of manufacturing an electronic device embedded printed circuit board in accordance with an embodiment of the present invention.

Firstly, the core substrate 110 is prepared (see FIG. 13). Formed on the surface of the core substrate 110 can be the inner circuits 114a, 114b, in which case the upper and lower surfaces of the core substrate 110 are connected with each other through a via 112.

Figure 14:
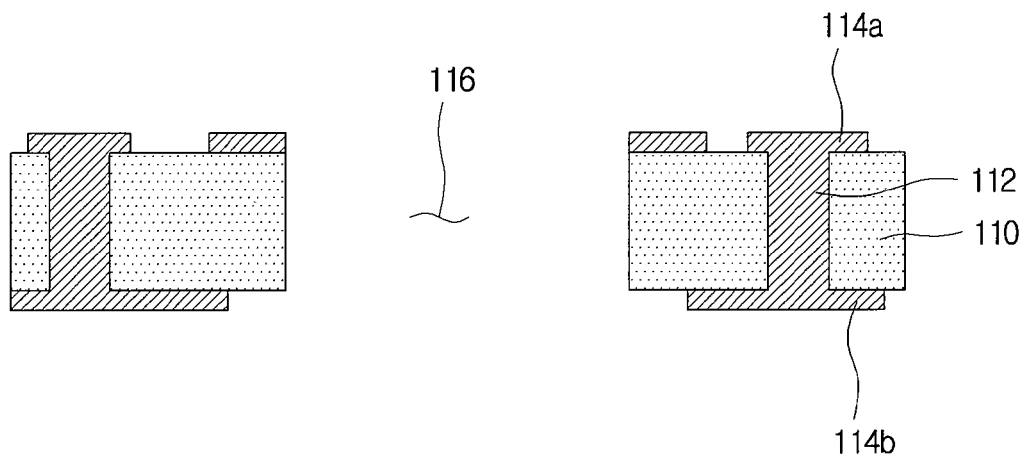

Next, the cavity 116 is perforated in the core substrate 110 (see FIG. 14). The cavity 116 is where the electronic device 120 is embedded later, and can be processed in a proper size and shape by considering the size and shape of the electronic device being embedded. A mechanical drill or laser drill can be used for processing the cavity 116 in the core substrate 110.

Figure 15:
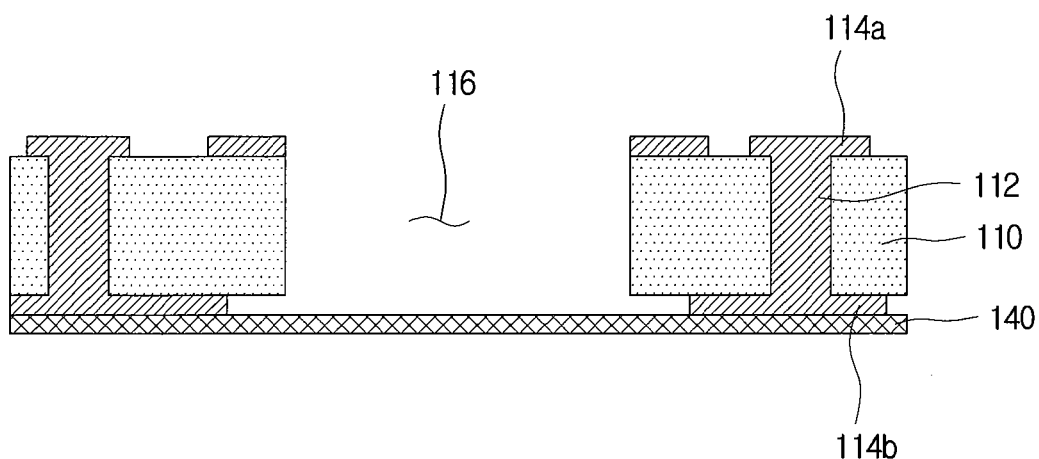
Figure 16:
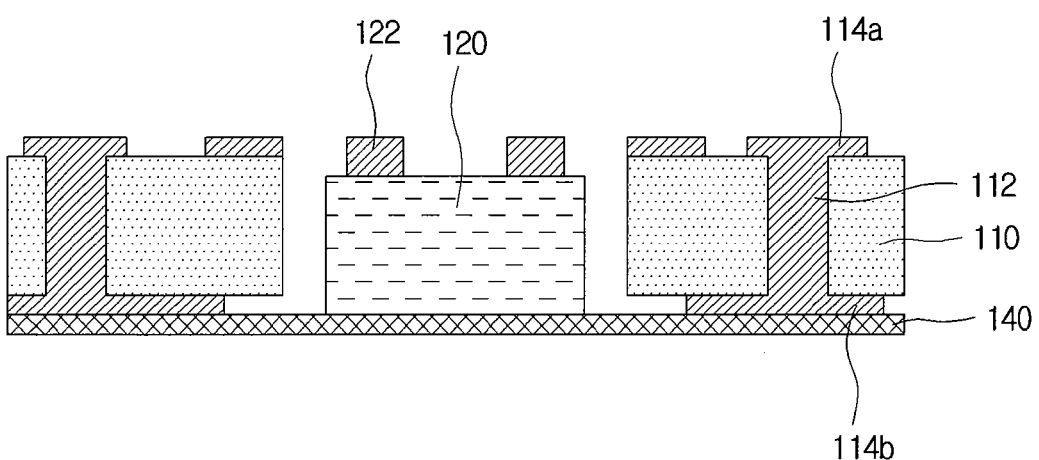

Then, an adhesive layer 140 is adhered to the lower surface of the core substrate 110 (see FIG. 15). By adhering the adhesive layer 140 on the lower surface of the core substrate, in which the cavity 116 is perforated, a lower side of the cavity becomes sealed by the adhesive layer 140.

Figure 17:
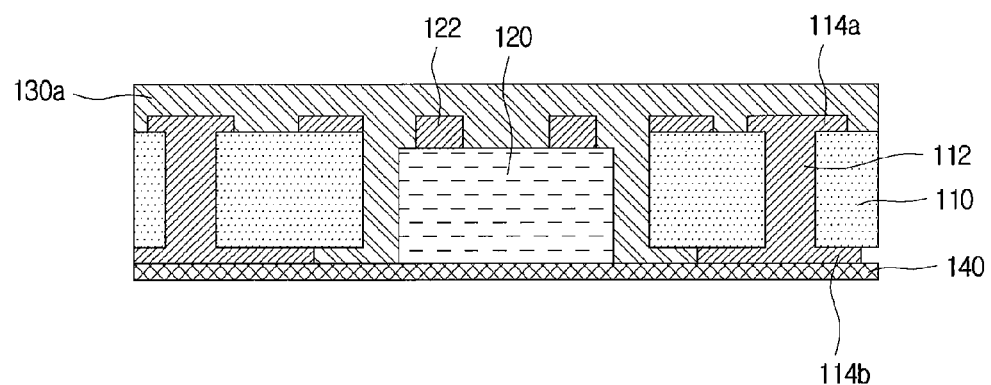

Next, the electronic device 120 is adhered by a face-up method to a surface of the adhesive layer 140 that is exposed through the cavity 116 (see FIG. 16), and then the electronic device 120 is covered by stacking the first insulation layer 130a on the upper surface of the core substrate 110 (see FIG. 17). The inside of the cavity 116, in which the electronic device 120 is embedded, is also filled by the first insulation layer 130a being stacked on the upper surface of the core substrate 110.

Figure 18:
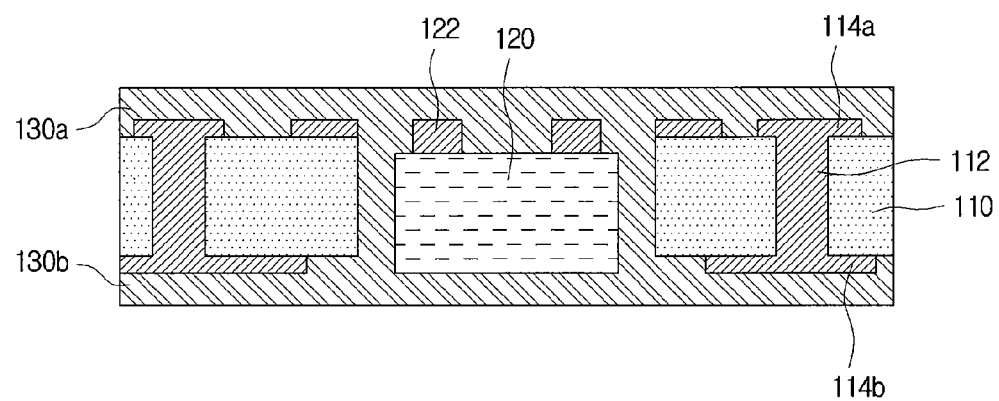

Then, the adhesive layer 140 adhered to the lower surface of the core substrate 110 is removed, and the second insulation layer 130b is stacked on the lower surface of the core substrate 110 (see FIG. 18).

Figure 19:
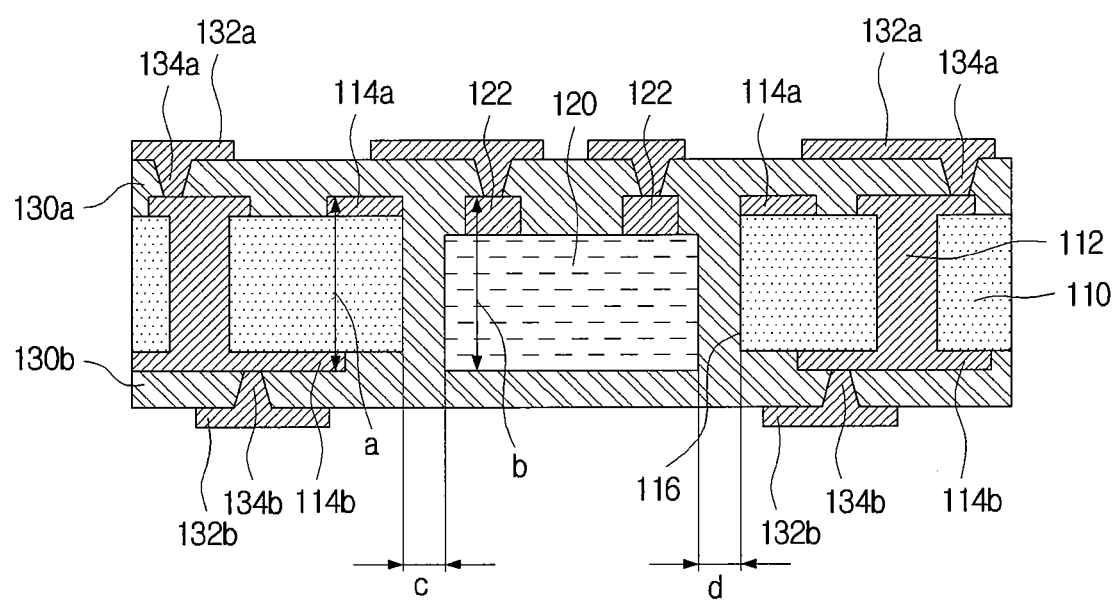

Afterwards, circuit patterns 132a, 132b and vias 134a, 134b are formed on the first insulation layer 130a and the second insulation layer 130b (see FIG. 19).

Hitherto, some embodiments of the present invention have been described. However, it shall be appreciated by anyone ordinarily skilled in the art to which the present invention pertains that there can be a variety of permutations and modifications of the present invention without departing from the technical ideas and scopes of the present invention that are disclosed in the claims appended below.

A large number of embodiments in addition to the above-described embodiments are present within the claims of the present invention.

What is claimed is:

1. An electronic device embedded printed circuit board, comprising:
    a core substrate;
    a first inner circuit formed on one surface of the core substrate, wherein a first area is demarcated on one surface of the core substrate by the first inner circuit;
    a second inner circuit formed on an other surface of the core substrate, wherein a second area is demarcated on the other surface of the core substrate by the second inner circuit and the second area is wider than the first area;
    a cavity formed to penetrate the core substrate on the basis of the first inner circuit, wherein a shape and a size of a transverse section of the cavity are the same as the first area, an upper area of the cavity has a same position as the first area and a lower area of the cavity is positioned inside the second area;
    an electronic device being embedded in the cavity, an electrode being formed on a surface of the electronic device;
    a first insulation layer being stacked on the one surface of the core substrate; and
    a second insulation layer being stacked on the other surface of the core substrate, the second insulation layer having a same thickness as the first insulation layer,
    wherein the second inner circuit is separated from an inner wall of the cavity in an outward direction.

2. The electronic device embedded printed circuit board of claim 1, wherein:
    a thickness of the electronic device including a thickness of the electrode is same as a thickness of the core substrate including a thickness of the first inner circuit and the second inner circuit.

3. The electronic device embedded printed circuit board of claim 1, wherein a sum of distances from either vertical side of the electronic device to the inner wall of the cavity is 60 um or greater and 160 um or less.

4. The electronic device embedded printed circuit board of claim 1, wherein a lateral-side surface of the first inner circuit is located on a same surface as the inner wall of the cavity.

5. The electronic device embedded printed circuit board of claim 1, wherein a shape and a size of a transverse section of the cavity are consistent from the one surface to the other surface of the core substrate.

6. The electronic device embedded printed circuit board of claim 1, wherein a center of an upper area of the cavity and a center of a lower area of the cavity are placed on a same vertical line.

7. The electronic device embedded printed circuit board of claim 1, wherein a size of a transverse section of the cavity increases from the one surface to the other surface of the core substrate in such a way that the inner wall of the cavity has a slope.

8. The electronic device embedded printed circuit board of claim 1, wherein a portion of the first inner circuit demarcating the first area is electrically insulated from remaining portions of the first inner circuit.

9. The electronic device embedded printed circuit board of claim 1, wherein a portion of the second inner circuit demarcating the second area is electrically insulated from remaining portions of the second inner circuit.

10. The electronic device embedded printed circuit board of claim 1, further comprising:
   a circuit pattern formed, respectively, on the first insulation layer and the second insulation layer; and
   a via configured to electrically connect the circuit pattern with the electrode of the electronic device.

11. The electronic device embedded printed circuit board of claim 1, wherein the electronic device is embedded in a face-up method.

* * * * *